United States Patent
Arai

(10) Patent No.: US 10,969,442 B2
(45) Date of Patent: Apr. 6, 2021

(54) TEST SYSTEM

(71) Applicant: Kabushiki Kaisha Nihon Micronics, Musashino (JP)

(72) Inventor: Osamu Arai, Musashino (JP)

(73) Assignee: Kabushiki Kaisha Nihon Micronics, Musashino (JP)

( * ) Notice: Subject to any disclaimer, the term of this patent is extended or adjusted under 35 U.S.C. 154(b) by 177 days.

(21) Appl. No.: 16/054,587

(22) Filed: Aug. 3, 2018

(65) Prior Publication Data

US 2019/0056458 A1    Feb. 21, 2019

(30) Foreign Application Priority Data

Aug. 18, 2017  (JP) .............................. JP2017-158070

(51) Int. Cl.
| | |
|---|---|
| *G01R 31/00* | (2006.01) |
| *G01R 31/44* | (2020.01) |
| *G01R 31/28* | (2006.01) |
| *G01R 31/26* | (2020.01) |
| *H05B 47/20* | (2020.01) |

(52) U.S. Cl.
CPC ......... *G01R 31/44* (2013.01); *G01R 31/2635* (2013.01); *G01R 31/2865* (2013.01); *G01R 31/2886* (2013.01); *H05B 47/20* (2020.01)

(58) Field of Classification Search
USPC ............ 324/750.03, 754.23; 356/614, 237.3, 356/237.1
See application file for complete search history.

(56) References Cited

U.S. PATENT DOCUMENTS

| | | | |
|---|---|---|---|
| 6,271,916 B1* | 8/2001 | Marxer .............. | G01N 21/9501 356/237.3 |
| 2003/0095260 A1* | 5/2003 | Yoneda .............. | G01N 21/8806 356/446 |
| 2004/0027586 A1* | 2/2004 | Ichikawa ............... | G01B 11/14 356/614 |
| 2005/0194990 A1 | 9/2005 | Ghiron et al. | |
| 2007/0268483 A1* | 11/2007 | Yatsugake .............. | G01N 21/84 356/237.1 |
| 2009/0173724 A1 | 7/2009 | Iida et al. | |

(Continued)

FOREIGN PATENT DOCUMENTS

| | | |
|---|---|---|
| JP | 2002-246578 A | 8/2002 |
| JP | 2005-252038 A | 9/2005 |

(Continued)

OTHER PUBLICATIONS

Korean Office Action dated Dec. 4, 2019 for the corresponding Korean Patent Application No. 10-2018-0094767.

(Continued)

*Primary Examiner* — Vincent Q Nguyen
(74) *Attorney, Agent, or Firm* — Leason Ellis LLP

(57) ABSTRACT

A test system is characterized by a holding unit that holds a light-receiving unit receiving light emitted from a test object and an optical path forming unit that is formed with an optical transmission path as a path of the light received by the light-receiving unit, in which the optical transmission path is formed of a different member from the light-receiving unit. Since the test system has such a configuration, replacement of the light-receiving unit that receives the light emitted from the test object can be facilitated.

11 Claims, 6 Drawing Sheets

(56) References Cited

U.S. PATENT DOCUMENTS

2011/0318851 A1* 12/2011 Godo ................ G01R 31/2625
  438/17
2015/0008945 A1   1/2015 Arai et al.

FOREIGN PATENT DOCUMENTS

| KR | 10-2006-0130679 A | 12/2006 |
| TW | 2007-46274 A | 12/2007 |
| TW | 2012-16575 A | 4/2012 |
| TW | 2015-14503 A | 4/2015 |

OTHER PUBLICATIONS

Taiwanese Office Action dated Nov. 29, 2019 for the corresponding Taiwanese Patent Application No. 107126820.

* cited by examiner

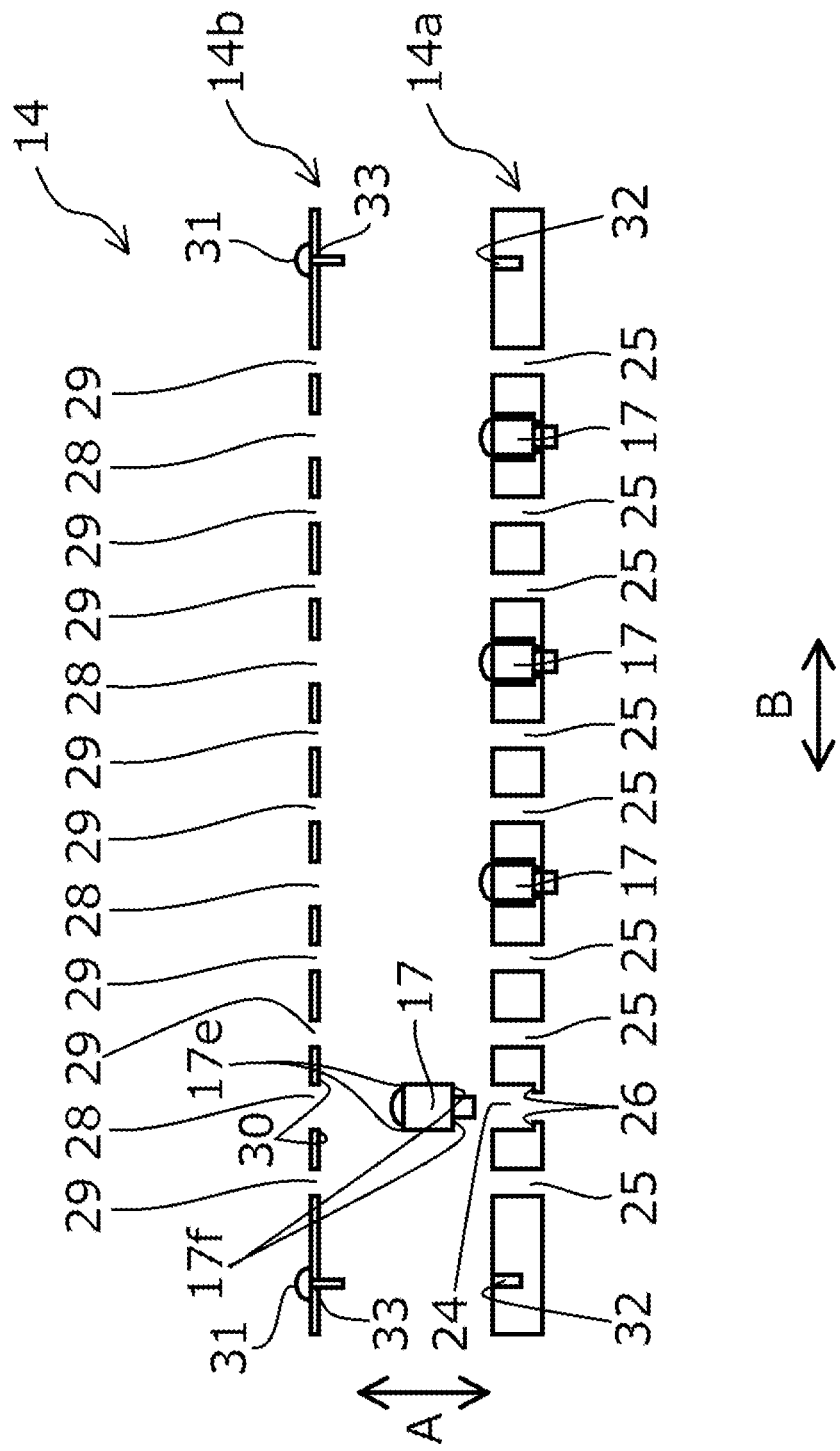

TEST SYSTEM

This application claims the benefit of Japanese Patent Application No. 2017-158070 filed on Aug. 18, 2017, which is incorporated herein by reference in its entirety.

FIELD OF THE INVENTION

The present invention relates to a test system.

BACKGROUND OF THE INVENTION

Conventionally, various types of test systems such as a probe card have been used. For example, a probe card for testing of a light-receiving device, a probe card for testing of a light-emitting device, and the like have been used. The probe card for testing of the light-receiving device is used for a test object that is the light-receiving device such as a CMOS image sensor, and the probe card for testing of the light-emitting device is used for the test object that is the light-emitting device as disclosed in Japanese Unexamined Publication No. 62-58650 and Japanese Unexamined Publication No. 7-201945.

Problem to be Solved by the Invention

As disclosed in Japanese Unexamined Publication No. 62-58650 and Japanese Unexamined Publication No. 7-201945, the conventional test system has a light-receiving unit that receives light emitted from the test object, and there is a case where a user desires to replace the light-receiving unit. For example, there is a case where the test system has the plural light-receiving units, part of the light-receiving units fails, and thus replacement thereof is desired. Furthermore, there is a case where the test system is configured to be able to test plural types of the test objects and attachment/detachment of the light-receiving unit(s) is desired in accordance with a type of the test object.

However, in the test system (a non-contact type probe card) disclosed in Japanese Unexamined Publication No. 62-58650, the light-receiving unit is configured to include an optical transmission cable, and the optical transmission cable also has to be replaced upon replacement of the light-receiving unit. Thus, the test system is not configured to allow easy replacement of the light-receiving unit.

In regard to the test system (a semiconductor test system) disclosed in Japanese Unexamined Publication No. 7-201945, in addition to such a configuration, in which the light-receiving unit is integrated with an optical fiber (a configuration that hinders the easy replacement of the light-receiving unit), a configuration, in which a light receiver that serves as the various types of the light-receiving units in included, is disclosed. However, Japanese Unexamined Publication No. 7-201945 only mentions about downsizing, simplification of a structure, and cost cut of the light receiver, and a relationship between the light receiver and a path of the light received by said light receiver is not clearly described. Thus, it can be said that the test system is not configured to allow the easy replacement of the light-receiving units.

As described above, the replacement of the light-receiving unit is difficult for the conventional test system that has the light-receiving unit receiving the light emitted from the test object.

The purpose of the present invention is to make it easy to replace a light-receiving unit that receives light emitted from a test object in a test system.

SUMMARY OF THE INVENTION

Means for Solving the Problem

A test system according to a first aspect of the present invention is configured by including: a holding unit that holds a light-receiving unit receiving light emitted from a test object; and an optical path forming unit that is formed with an optical transmission path as a path of the light received by the light-receiving unit, in which the optical transmission path is formed of a different member from the light-receiving unit.

According to this aspect, the test system separately includes: the holding unit that holds the light-receiving unit; and the optical path forming unit that is formed with the path of the light received by the light-receiving unit. In addition, the test system separately includes the light-receiving unit and the optical transmission path. Accordingly, for example, in the test system, the selected light-receiving unit is detached from the holding unit by detaching said holding unit from the optical path forming unit, or the entire holding unit, which holds the light-receiving unit, is replaced. In this way, the light-receiving unit can easily be replaced.

A test system according to a second aspect of the present invention is characterized that the test system in the first aspect includes: a probe that contacts the test object; and electrical wiring that is electrically connected to the probe.

According to this aspect, the test system includes: the probe that contacts the test object; and the electrical wiring that is electrically connected to said probe. Accordingly, the test system can easily test the test object when applying a voltage to the test object via the probe and causing the test object to emit the light, or the like.

A test system according to a third aspect of the present invention is characterized that, in the first or second aspect, the light-receiving unit is a lens to which the light emitted from the test object converges, and the holding unit and the optical path forming unit are arranged at separate positions in an advancing direction of the light.

According to this aspect, the light-receiving unit is the lens to which the light emitted from the test object converges. Thus, the light-receiving unit can efficiently gather the light emitted from the test object. In addition, since the holding unit and the optical path forming unit are arranged at the separate positions in the advancing direction of the light, the test system can efficiently gather the light, which is converged by the lens, near a position of a focus of the light.

A test system according to a fourth aspect of the present invention is characterized that the test system in the third aspect includes: a space adjustment unit that adjusts a space between the holding unit and the optical path forming unit in the advancing direction of the light.

According to this aspect, the test system includes the space adjustment unit that adjusts the space between the holding unit and the optical path forming unit in the advancing direction of the light. Thus, the light converged by the lens can particularly be gathered near the position of the focus of the light by adjusting said space.

A test system according to a fifth aspect of the present invention is characterized that, in the fourth aspect, the space adjustment unit has a screw.

According to this aspect, since the space adjustment unit has the screw, it is possible to easily adjust the space and easily form the space adjustment unit in the test system.

A test system according to a sixth aspect of the present invention is characterized that, in any one of the third to fifth aspects, the optical path forming unit has a mirror at a position where the light emitted from the test object is converged by the lens. Here, the mirror changes the advancing direction of the light.

According to this aspect, the test system has the mirror, which changes the advancing direction of the light, at the position where the light emitted from the test object is converged by the lens. Thus, the light converged by the lens can be gathered near the position of the focus of the light, and an optical path can favorably be arranged in the optical path forming unit by changing the advancing direction of the light.

A test system according to a seventh aspect of the present invention is characterized that, in any one of the first to sixth aspects, the holding unit is configured to be able to attach/detach the light-receiving unit.

According to this aspect, the holding unit is configured to be able to allow attachment/detachment of the light-receiving unit. Thus, for example, in the case where only part of the plural light-receiving units fails, only the failed light-receiving units can be replaced.

A test system according to an eighth aspect of the present invention is characterized that, in the seventh aspect, the light-receiving unit has a projection in a direction that crosses an attachment/detachment direction of the light-receiving unit, and the holding unit has a contact section that contacts the projection in the attachment/detachment direction of the light-receiving unit when the light-receiving unit is attached.

According to this aspect, the light-receiving unit has the projection projected in the direction that crosses the attachment/detachment direction of said light-receiving unit, and the holding unit has the contact section that contacts the projection in the attachment/detachment direction of the light-receiving unit. With such a configuration, the test system is formed to have the configuration to allow easy attachment/detachment of the light-receiving unit to/from the holding unit.

A test system according to a ninth aspect of the present invention is characterized that, in the eighth aspect, the holding unit has a pressing section that presses the projection on an opposite side from the contact section in the attachment/detachment direction of the light-receiving unit when the light-receiving unit is attached.

According to this aspect, the holding unit has the pressing section that presses the projection on the opposite side from the contact section in the attachment/detachment direction of the light-receiving unit. Thus, the holding unit can reliably hold the light-receiving unit when the light-receiving unit is attached.

A test system according to a tenth aspect of the present invention is characterized that, in any one of the first to ninth aspects, the light-receiving unit is assembled in a through hole formed in the holding unit and that at least apart of an end thereof in a direction that crosses the advancing direction of the light is coated with an organic insulating film.

According to this aspect, at least part of the end of the light-receiving unit in the direction that crosses the advancing direction of the light is coated with the organic insulating film. Accordingly, the organic insulating film that is interposed between the end of the light-receiving unit and an inner surface of the through hole functions as a cushion, and the light-receiving unit can be held in the through hole of the holding unit in the test system.

BRIEF DESCRIPTION OF THE DRAWINGS

These and other features and advantages of the present invention will become more readily appreciated when considered in connection with the following detailed description and appended drawings, wherein like designations denote like elements in the various views, and wherein:

FIG. 3 is a schematic cross-sectional view of the holding unit of the test system according to Embodiment 1 of the present invention.

DETAILED DESCRIPTION OF THE INVENTION

A description will hereinafter be made on a test system 1 according to an example of the present invention.

[Embodiment 1] (FIG. 1 to FIG. 4)

First, an overview of the test system 1 in Embodiment 1 will be described.

Figure 1:
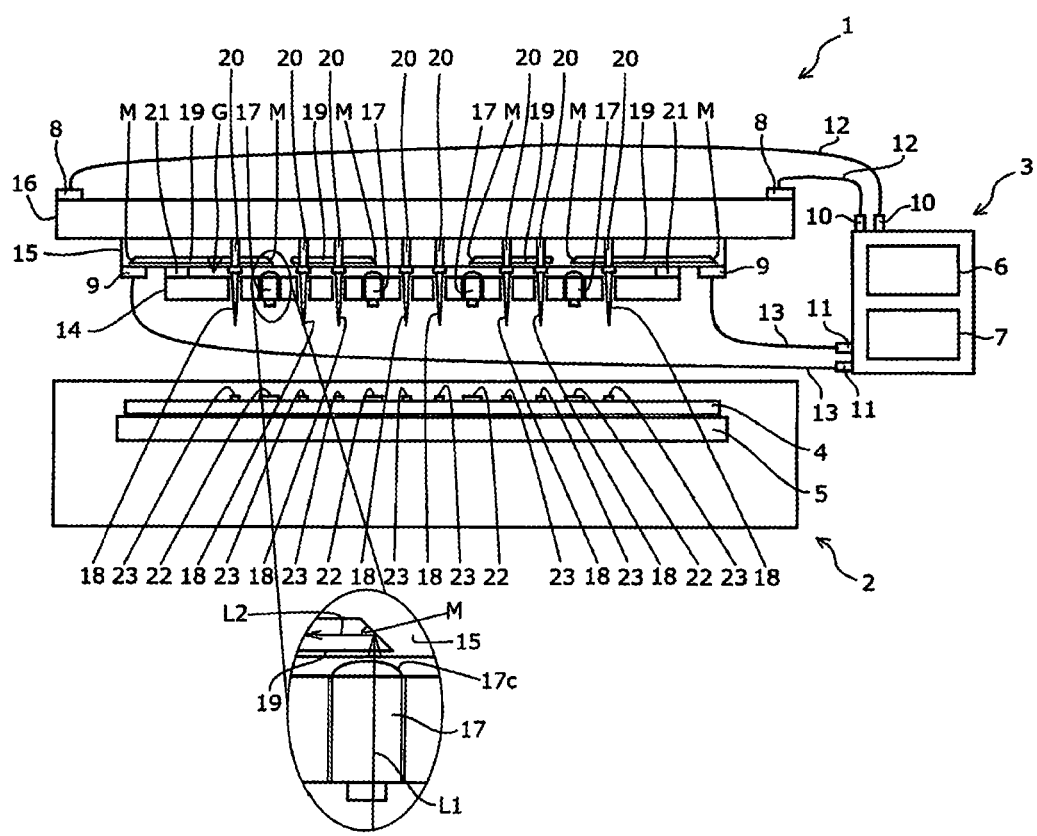
FIG. 1 is a schematic cross-sectional view of a test system according to Embodiment 1 of the present invention.

FIG. 1 is a schematic cross-sectional view of the test system 1 in this embodiment.

The test system 1 in this embodiment is a probe card for testing of a light-emitting device, and a test object 4 (a silicon wafer) is the light-emitting device. As shown in FIG. 1, the test system 1 in this embodiment is a test system capable of testing the test object 4 that is placed on a stage 5 of a prober 2. Upon testing of the test object 4, the test system 1 is connected to a tester 3 that has electrical characteristic measurement equipment 6 and optical characteristic measurement equipment 7. The test system 1 is provided with a terminal 8 for electric transmission and a terminal 9 for optical transmission. The tester 3 is provided with a terminal 10 for the electric transmission and a terminal 11 for the optical transmission. The terminal 8 and the terminal 10 are connected by a cable 12 for the electric transmission, and the terminal 9 and the terminal 11 are connected by a cable 13 for the optical transmission. In this way, the test system 1 is connected to the tester 3.

In addition, as shown in FIG. 1, the test system 1 in this embodiment includes a holding unit 14 that holds a light-receiving unit 17, a detail of which will be described below. The test system 1 in this embodiment also includes a hybrid board 15, and the hybrid board 15 is formed by hybridization of an electric transmission path 20 to which a probe 18 is attached (that is connected to the probe 18) and an optical transmission path 19 that transmits light received by the light-receiving unit 17. The test system 1 in this embodiment further includes an electrical wiring board 16 that is formed with an unillustrated electric transmission path (electrical wiring) that connects the electric transmission path 20 and the terminal 8. Note that the holding unit 14 in this embodiment is formed of a ceramic, and a material therefor is not particularly limited; however, the holding unit 14 in this embodiment is preferably formed of an insulating material.

Here, a spacer 21 is formed between the holding unit 14 and the hybrid board 15, and a gap G is provided between the holding unit 14 and the hybrid board 15. Although a detail will be described below, the light-receiving unit 17 is formed with a convex lens 17c (see FIG. 4A) at an end on a side that opposes the hybrid board 15, and the gap G is adjusted such that a focus of the light emitted from the convex lens 17c is directed onto a position of a mirror M in the optical transmission path 19.

Note that the mirror M is provided at a position that opposes each of the plural light-receiving units 17 (the convex lenses 17c) formed in the optical transmission path 19. The mirror M is also provided at a position that opposes the terminal 9 in the optical transmission path 19. Each of the mirrors M provided at the position opposing the light-receiving unit 17 are connected with the mirrors M provided at the position opposing the terminal 9 via the optical transmission path 19. With such a configuration of the optical transmission path 19, it is configured that, even when the light is emitted from any of all the light-receiving units 17, the light is transmitted to the terminal 9.

As described above, the test system 1 in this embodiment is the probe card for testing of the light-emitting device, and the test object 4 is the light-emitting device. Thus, the test object 4 is formed with a wafer pad 23 as an electrical connection unit and a light-emitting unit 22. The test system 1 in this embodiment is configured that the probe 18 comes in contact with and is electrically connected to the wafer pad 23 of the test object 4, which is placed on the stage 5, and the light-receiving unit 17 receives the light emitted from the light-emitting unit 22. Then, the test system 1 in this embodiment is configured to be able to test the test object 4 when the optical characteristic measurement equipment 7 of the tester 3 checks presence/absence of reception of the light, which is emitted from the light-emitting unit 22, by the light-receiving unit 17 while the electrical characteristic measurement equipment 6 of the tester 3 checks the electrical connection between the probe 18 and the test object 4.

More specifically, the test system 1 transmits electricity from the tester 3 via the terminal 10, the cable 12, and the terminal 8 and then transmits the electricity to the test object 4 via the unillustrated electric transmission path of the electrical wiring board 16, the electric transmission path 20 of the hybrid board 15, the probe 18 (an electrical input probe), and the wafer pad 23 (an electrical input wafer pad). Then, the light-emitting unit 22 emits the light by using the electricity transmitted to the test object 4, and the electricity is transmitted from the wafer pad 23 (an electrical output wafer pad) to the probe 18 (an electrical output probe). The light emitted from the light-emitting unit 22 is transmitted to the tester 3 via the light-receiving unit 17, the optical transmission path 19, the terminal 9, the cable 13, and the terminal 11. The electricity that is transmitted from the wafer pad 23 (the electrical output wafer pad) to the probe 18 (the electrical output probe) is transmitted to the tester 3 via the electric transmission path 20 of the hybrid board 15, the unillustrated electric transmission path of the electrical wiring board 16, the terminal 8, the cable 12, and the terminal 10.

As described above, the test system 1 in this embodiment includes: the holding unit 14 that holds the light-receiving unit 17 receiving the light emitted from the test object 4; and the hybrid board 15 as an optical path forming unit in which the optical transmission path 19 as the path of the light received by the light-receiving unit 17 is formed of a different member from the light-receiving unit 17. Just as described, the test system 1 in this embodiment includes the holding unit 14, which holds the light-receiving unit 17, and the hybrid board 15, which is formed with the path of the light received by the light-receiving unit 17, as separate components. In addition, the test system 1 in this embodiment includes the light-receiving unit 17 and the optical transmission path 19 as separate components. For example, the selected light-receiving unit 17 is detached from the holding unit 14 by detaching said holding unit 14 from the hybrid board 15. Alternatively, the entire holding unit 14, which holds the light-receiving unit 17, is replaced. In this way, the light-receiving unit 17 can easily be replaced. In other words, the test system 1 in this embodiment has the plural light-receiving units 17. Only part of the light-receiving units 17 can easily be replaced, or the light-receiving units 17 can be replaced all at once.

Here, the test system 1 in this embodiment includes: the probe 18 that comes in contact with the test object 4; and the electric transmission path 20 as the electrical wiring that is electrically connected to the probe 18. Accordingly, the test system 1 can easily test the test object 4 when applying a voltage to the test object 4 via the probe 18 and causing the light-emitting unit 22 of the test object 4 to emit the light.

However, the test system 1 is not limited to such a configuration. The test system 1 may be configured not to include the probe 18 and the electric transmission path 20 and may be configured to cause the light-emitting unit 22 of the test object 4 to emit the light by using an external device having a probe and an electric transmission path.

Note that, in this embodiment, the electrical wiring (the electric transmission path 20) that is electrically connected to the probe 18 is a pogo pin (a spring connector); however, a material, a shape (arrangement), and the like thereof is not particularly limited, and any of various types of the electrical wiring can be used as long as the electrical wiring is electrically connected to the probe 18 and can transmit the electricity.

Next, a detailed description will be made on the holding unit 14 of the test system 1 in this embodiment.

Figure 2:
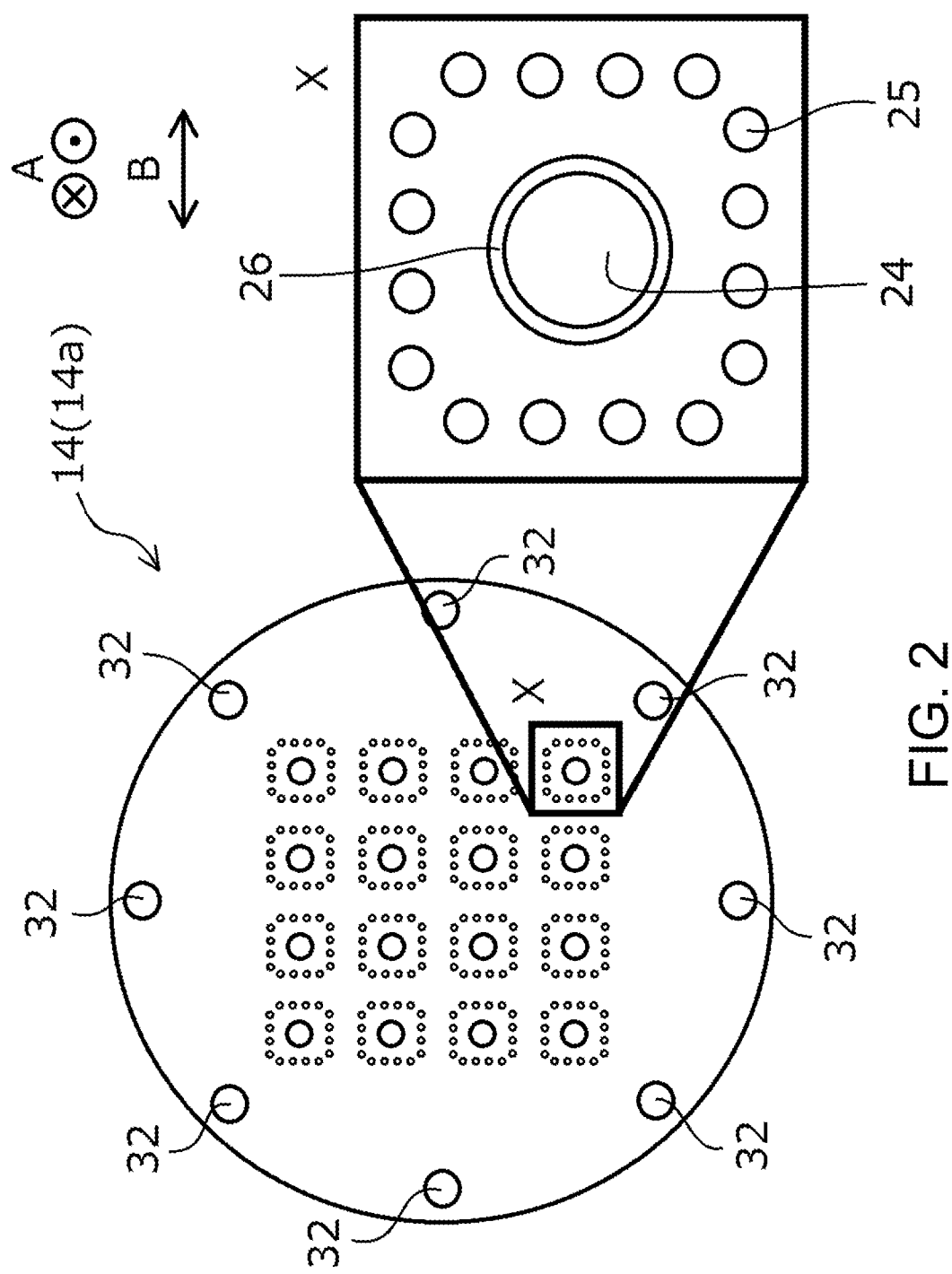
FIG. 2 is a schematic plan view of a holding unit of the test system according to Embodiment 1 of the present invention.
Figure 4A:
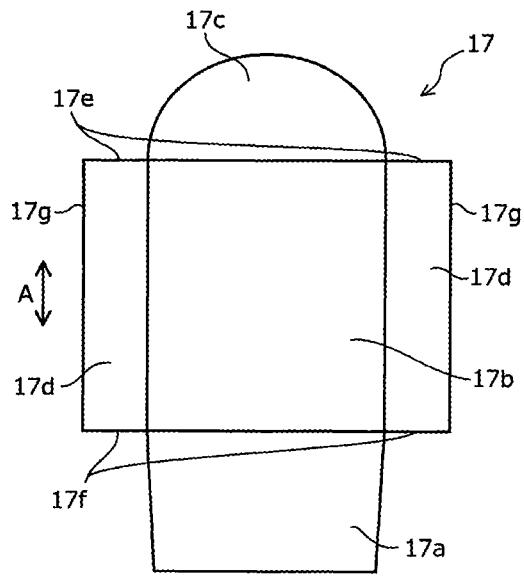
FIGS. 4A and 4B are schematic cross-sectional views of a light-receiving unit of the test system according to Embodiment 1 of the present invention.
Figure 4B:
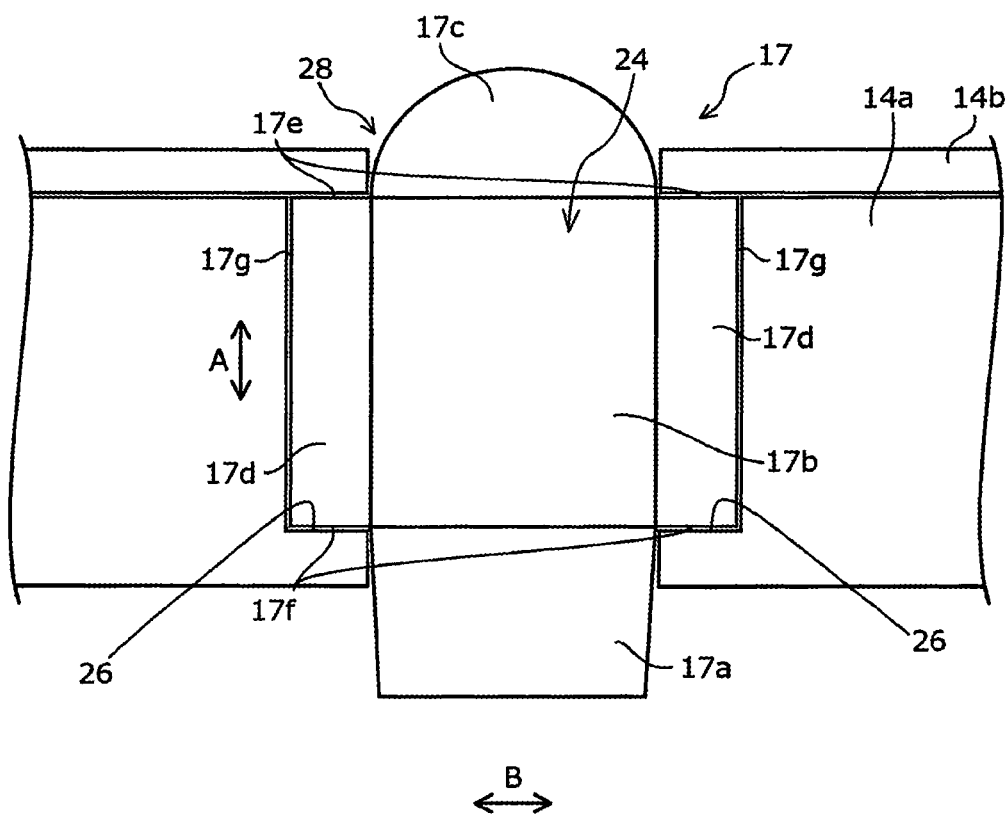

Here, FIG. 2 is a schematic plan view of the holding unit 14 of the test system 1 in this embodiment and is precisely a schematic view of a base body section 14a that is a member constituting the holding unit 14. Note that a partial region X of the base body section 14a is enlarged in FIG. 2. FIG. 3 is a schematic cross-sectional view of the holding unit 14 of the test system 1 in this embodiment and is an exploded view in which the holding unit 14 is broken down into the base body section 14a and a pressing section 14b. FIGS. 4A and 4B are schematic cross-sectional views of the light-receiving unit 17 of the test system 1 in this embodiment.

As shown in FIG. 3, the holding unit 14 in this embodiment has the base body section 14a and the pressing section 14b. The holding unit 14 is configured to hold the light-receiving unit 17 when being brought into a state where the light-receiving unit 17 is inserted in a bore 24 formed in the base body section 14a and is pressed by the pressing section 14b.

In addition, the holding unit 14 in this embodiment can fix the pressing section 14b to the base body section 14a by tightening a screw 31 into a screw hole 32 via a screw opening 33. Then, in the holding unit 14, the pressing section 14b can be detached from the base body section 14a when the screw 31 is unscrewed from the screw hole 32.

With such a configuration, the holding unit 14 in this embodiment is configured to be able to allow attachment/detachment of the light-receiving unit 17. Thus, the test system 1 in this embodiment is configured that only the failed light-receiving unit(s) 17 can be replaced when only part of the plural light-receiving units 17 fails, for example.

In addition, as described above, the holding unit 14 in this embodiment is configured to hold the light-receiving unit 17 when being brought into the state where the light-receiving unit 17 is inserted in the bore 24 formed in the base body section 14a and is pressed by the pressing section 14b. More specifically, the holding unit 14 is configured to hold the light-receiving unit 17 by placing a placed section 17f of the light-receiving unit 17 on a placing section 26 that is formed in the bore 24 of the base body section 14a and pressing a pressed section 17e of the light-receiving unit 17 by a peripheral region 30 of an opening 28 of the pressing section 14b.

In other words, the light-receiving unit 17 in this embodiment has a projection 17d projected in a direction B that crosses an attachment/detachment direction A of said light-receiving unit 17. The holding unit 14 (the base body section 14a) has the placing section 26 as a contact section that contacts the placed section 17f of the projection 17d in the attachment/detachment direction A of the light-receiving unit 17 when the light-receiving unit 17 is attached thereto. With such a configuration, the test system 1 in this embodiment is formed to have the configuration to easily attach/detach the light-receiving unit 17 to/from the holding unit 14.

As shown in FIG. 2, in the base body section 14a, plural bores 25 for holding the probe 18 are provided around the bore 24 for holding the light-receiving unit 17. In addition, as shown in FIG. 3, the pressing section 14b is provided with openings 29 for holding the probes 18 at positions corresponding to positions of the bores 25 in the base body section 14a. Since the bores 25 and the openings 29 are provided in such arrangement in the holding unit 14, each of the probes 18 is held by the test system 1 in a state where said probe 18 is inserted in the bore 25 and the opening 29.

As described above, the holding unit 14 in this embodiment has the pressing section 14b that presses the pressed section 17e of the projection 17d on an opposite side from the placing section 26 in the attachment/detachment direction A of the light-receiving unit 17 when the light-receiving unit 17 is attached. Accordingly, the test system 1 in this embodiment is configured to be able to reliably hold the light-receiving unit 17 when the light-receiving unit 17 is attached.

Note that the holding unit 14 in this embodiment has the pressing section 14b, just as described; however, the holding unit 14 may be configured not to have the pressing section 14b as long as the holding unit 14 is configured to be able to appropriately hold the light-receiving unit 17.

Next, the light-receiving unit 17 will be described in further detail with reference to FIG. 4A.

As shown in FIG. 4A, the light-receiving unit 17 in this embodiment has: an incident section 17a to which the light emitted from the light-emitting unit 22 of the test object 4 enters; a path section 17b as a transmission path of said light; the convex lens 17c that emits said light toward the optical transmission path 19 of the hybrid board 15; and the projection 17d that is formed around the path section 17b and is formed of a clad material. The projection 17d is formed with the pressed section 17e on the hybrid board 15 side in the attachment/detachment direction A of the light-receiving unit 17, and is also formed with the placed section 17f on the test object 4 side.

With such a configuration, the light-receiving unit 17 in this embodiment is a lens to which the light emitted from the test object 4 converges. Thus, the light-receiving unit 17 in this embodiment is configured to be able to efficiently gather the light emitted from the test object 4.

Due to such a configuration of the light-receiving unit 17, as shown in FIG. 1, the holding unit 14 and the hybrid board 15 are arranged at separate positions in an advancing direction of the light. In this way, the test system 1 in this embodiment is configured to be able to efficiently gather the light converged by the lens. This is because the light converged by the lens can be gathered near a position of a focus of the light when the holding unit 14 and the hybrid board 15 are separated from each other in comparison with a case where the holding unit 14 and the hybrid board 15 are not separated from each other.

Note that a material, a shape, and the like of the light-receiving unit 17 are not particularly limited. While each of the incident section 17a, the path section 17b, and the convex lens 17c only has to be formed of a material that can transmit the light, the projection 17d may not be formed of the material that can transmit the light. However, a material of the path section 17b preferably has a lower refractive index than a material of the projection 17d. In addition, the incident section 17a, the path section 17b, the convex lens 17c, and the projection 17d may integrally be shaped by using the same material or the like. The light-receiving unit 17 may have a shape that does not include the projection 17d as long as the light-receiving unit 17 can appropriately be held by the holding unit 14. Furthermore, the incident section 17a may be a convex lens, or the side of the light-receiving unit 17 that emits the light toward the optical transmission path 19 may be configured to have a component other than the convex lens. Just as described, the material of the light-receiving unit 17 is not particularly limited. However, from perspectives of performance and manufacturability, the light-receiving unit 17 is preferably made of a synthetic resin.

In addition, the light-receiving unit 17 in this embodiment is assembled in a through hole (the bore 24) that is formed in the holding unit 14, and a periphery (a side surface portion 17g as an end in a direction that crosses the advancing direction of the light) of the projection 17d in this embodiment is coated with an organic insulating film. Just as described, at least a part of the end of the light-receiving unit 17 in the direction that crosses the advancing direction of the light is preferably coated with the organic insulating film. In this way, the organic insulating film functions as a cushion between the light-receiving unit 17 and the bore 24 of the holding unit 14, and the light-receiving unit 17 can be assembled and held in the bore 24. More specifically, the organic insulating film can suppress a rattle of the light-receiving unit 17 against the bore 24 in a direction along the attachment/detachment direction A of the light-receiving unit 17 and in a direction along the direction B, which crosses said direction A. The organic insulating film is not particularly limited as long as it is a film made of an insulating organic material.

Note that the holding unit 14 in this embodiment is configured to have the pressing section 14b; however, even in the case where the holding unit 14 in this embodiment is configured not to have the pressing section 14b, the holding unit 14 in this embodiment can reliably hold (fix) the light-receiving unit 17 in the bore 24 thereof as long as the periphery of the light-receiving unit 17 is coated with the organic insulating film.

Here, thickness of the organic insulating film is not particularly limited; however, it is preferred that the organic insulating film coating the periphery (the side surface portion 17g) of the light-receiving unit 17 has such a degree of the thickness that the organic insulating film is interposed between the side surface portion 17g and an inner peripheral surface of the bore 24 and is pressed by said inner peripheral surface.

As shown in FIG. 1, in the test system 1 in this embodiment, the hybrid board 15 has the mirror at a position where the light emitted from the test object 4 is converged by the light-receiving unit 17 as the lens (near the position of the focus of the light), and the mirror changes the advancing direction of the light. Accordingly, the test system 1 in this embodiment can gather the light converged by the light-receiving unit 17 near the position of the focus of the light. In addition, in the test system 1 in this embodiment, a path of the light (the optical transmission path 19) is preferably arranged in the hybrid board 15 by changing the advancing direction of the light.

The test system 1 in this embodiment is configured that the holding unit 14 and the hybrid board 15 are fixed and arranged at the separate positions in the advancing direction of the light by the spacer 21. However, the test system 1 in this embodiment is not limited to such a configuration. The test system 1 in this embodiment is further preferably configured to be able to change a space (the gap G) between the holding unit 14 and the hybrid board 15.

Thus, a description will hereinafter be made on an embodiment in which the space between the holding unit 14 and the hybrid board 15 can be changed.

Figure 5:
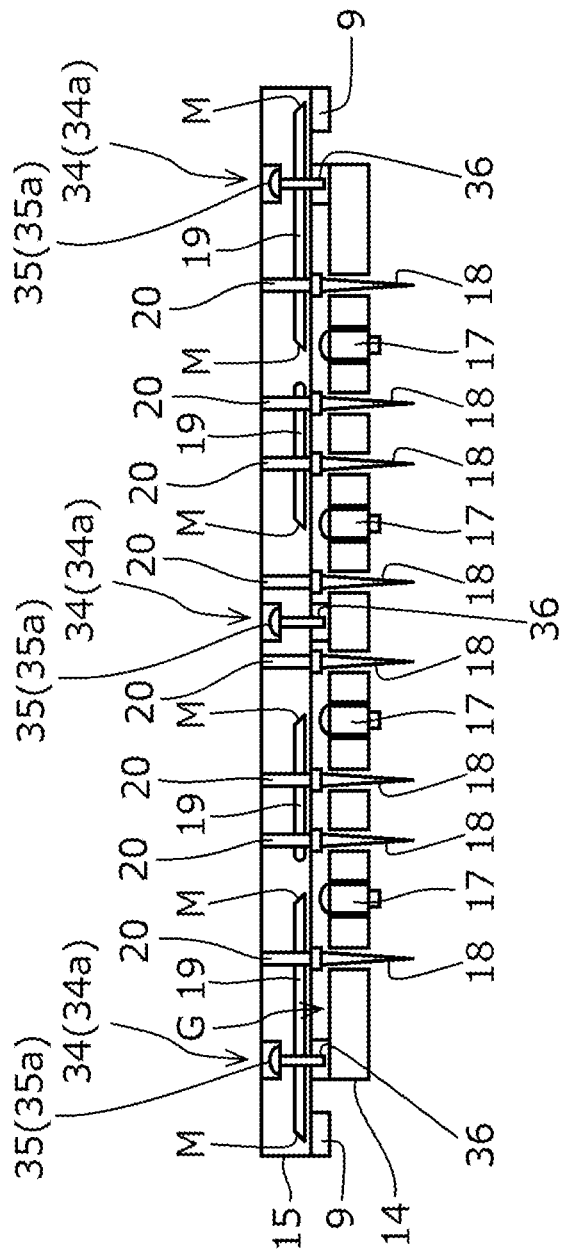
FIG. 5 is a schematic cross-sectional view of an optical path forming unit and a holding unit of a test system according to Embodiment 2 of the present invention.

[Embodiment 2] (FIG. 5)

FIG. 5 is a schematic cross-sectional view of the hybrid board 15 (an optical path forming unit) and the holding unit 14 of a test system in this embodiment. Note that common components to those in above Embodiment 1 will be denoted by the same reference numerals and symbols and the detailed description thereon will not be made.

The test system in this embodiment has the same configuration as the test system 1 in Embodiment 1 except for a connecting portion between the hybrid board 15 and the holding unit 14.

As shown in FIG. 5, the test system in this embodiment includes a space adjustment unit 34 (a space adjustment unit 34a) that adjusts the space (the gap G) between the holding unit 14 and the hybrid board 15 in the advancing direction of the light. Accordingly, the test system in this embodiment can gather the light converged by the lens (the holding unit 14) particularly near the position of the focus of the light by adjusting said space.

In addition, the space adjustment unit 34a in this embodiment is configured to have a screw 35 (a screw 35a). Thus, it is possible to easily adjust the space and easily form the space adjustment unit.

Here, the holding unit 14 in this embodiment is formed with a screw hole 36, and the space adjustment unit 34a is configured that the screw 35a is tightened in the screw hole 36 and that the space can be adjusted in accordance with a degree of tightening of the screw 35a.

Figure 6:
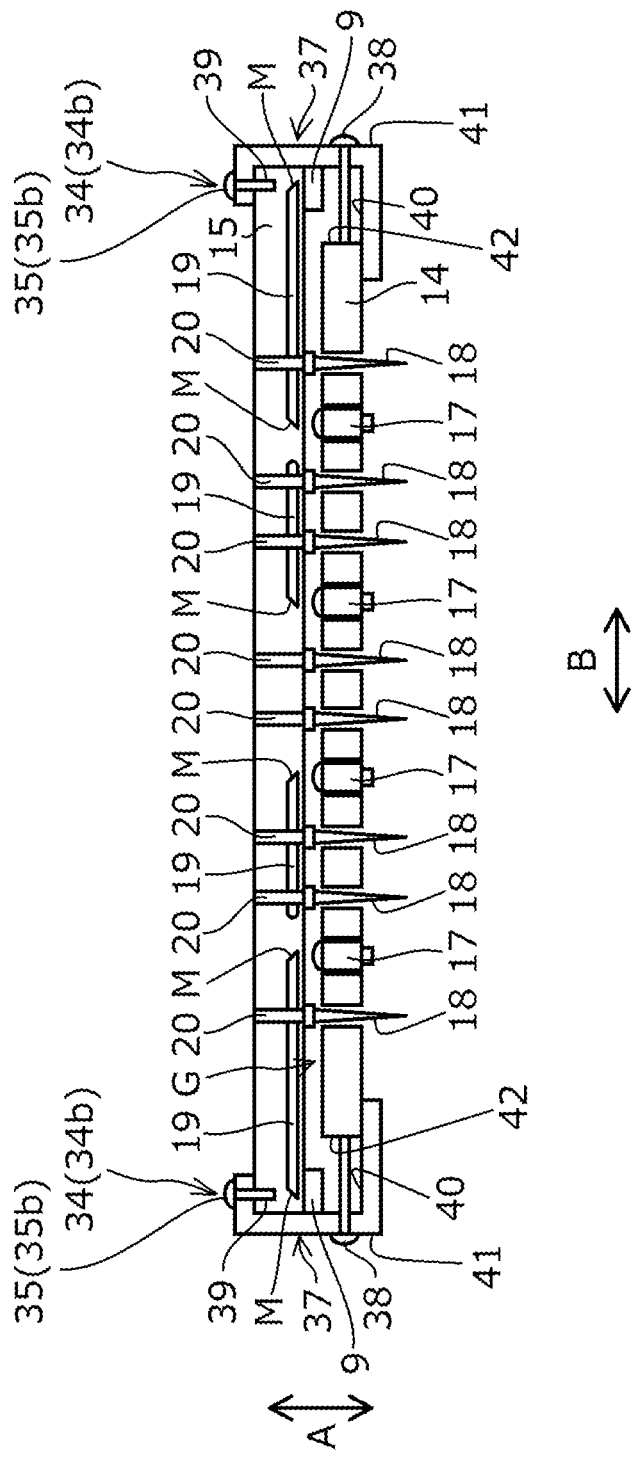
FIG. 6 is a schematic cross-sectional view of the optical path forming unit and the holding unit of the test system according to Embodiment 2 of the present invention.

[Embodiment 3] (FIG. 6)

FIG. 6 is a schematic cross-sectional view of the hybrid board 15 (the optical path forming unit) and the holding unit 14 of a test system in this embodiment. Note that common components to those in above Embodiment 1 will be denoted by the same reference numerals and symbols and the detailed description thereon will not be made.

The test system in this embodiment has the same configuration as the test system 1 in Embodiment 1 except for the connecting portion between the hybrid board 15 and the holding unit 14.

As shown in FIG. 6, similar to the test system in Embodiment 2, the test system in this embodiment has the space adjustment unit 34 (a space adjustment unit 34b) that adjusts the space (the gap G) between the holding unit 14 and the hybrid board 15 in the advancing direction of the light. Accordingly, similar to the test system in Embodiment 2, the test system in this embodiment can gather the light converged by the lens (the holding unit 14) particularly near the position of the focus of the light by adjusting said space.

In addition, similar to the test system in Embodiment 2, the space adjustment unit 34b in this embodiment is configured to include the screw 35 (a screw 35b). Thus, it is possible to easily adjust the space and easily form the space adjustment unit.

Here, the test system in this embodiment includes a positioning unit 37 that positions the holding unit 14 with respect to the hybrid board 15. In a plan view (in a state where FIG. 6 is seen from the above), the positioning unit 37 in this embodiment is configured that two semicircle components are combined to form a circle as a whole in the plan view for use (configured to be able to divide the circular component in two in the plan view). In addition, the positioning unit 37 is configured to be able to cover the hybrid board 15 from an outer side (in the direction B that crosses the attachment/detachment direction A of the light-receiving unit 17). The hybrid board 15 is formed with a screw hole 39 and is configured that the screw 35b is tightened in the screw hole 39. In addition, the positioning unit 37 is configured to be movable in an adjustment direction of the space (a direction to expand the gap G and a direction to narrow the gap G) with respect to the hybrid board 15 in accordance with a degree of tightening of the screw 35b. The positioning unit 37 also has a placement surface 40 for the holding unit 14 and includes a screw 38 that can position and fix the holding unit 14. More specifically, the screws 38 are arranged at equally-spaced intervals in a circular outer peripheral wall 41 of the positioning unit 37 and each have length to be able to press an outer peripheral surface 42 of the holding unit 14 along the direction B. The positioning unit 37 in this embodiment is configured to be able to move the holding unit 14 along the placement surface 40 (slightly adjust and fix the position of the holding unit 14 with respect to the hybrid board 15 in the direction B) by adjusting an amount of tightening of the outer peripheral surface 42 by each of the screws 38.

Note that, as described above, in the test system in this embodiment, the space adjustment unit 34b has the plural screws 38 and is configured to be able to position and fix the holding unit 14 from the plural directions; however, positioning and fixing means of the holding unit 14 is not limited to such a configuration. In addition, a configuration and a shape of the positioning unit 37 are not particularly limited.

The present invention is not limited to above-described embodiments and can be implemented by having any of various configurations within the scope that does not depart from the gist thereof. For example, technical characteristics in embodiments that correspond to technical characteristics in aspects described in SUMMARY OF THE INVENTION can appropriately be replaced or combined to solve a part or the whole of the above-described problem or to achieve a part or all of the above-described effects. In addition, when any of those technical characteristics is not described as being essential in this specification, the technical characteristic(s) can appropriately be eliminated.

DESCRIPTION OF REFERENCE NUMERALS
AND SYMBOLS

1: TEST SYSTEM
2: PROBER
3: TESTER
4: TEST OBJECT
5: STAGE
6: ELECTRICAL CHARACTERISTIC MEASUREMENT EQUIPMENT
7: OPTICAL CHARACTERISTIC MEASUREMENT EQUIPMENT
8: ELECTRIC TRANSMISSION TERMINAL
9: OPTICAL TRANSMISSION TERMINAL
10: ELECTRIC TRANSMISSION TERMINAL
11: OPTICAL TRANSMISSION TERMINAL
12: ELECTRIC TRANSMISSION CABLE
13: OPTICAL TRANSMISSION CABLE
14: HOLDING UNIT
15: HYBRID BOARD (OPTICAL PATH FORMING UNIT)
16: ELECTRICAL WIRING BOARD
17: LIGHT-RECEIVING UNIT
17a: INCIDENT SECTION
17b: PATH SECTION
17c: CONVEX LENS
17d: PROJECTION
17e: PRESSED SECTION
17f: PLACED SECTION
17g: SIDE SURFACE PORTION (END IN DIRECTION CROSSING ADVANCING DIRECTION OF LIGHT)
18: PROBE
19: OPTICAL TRANSMISSION PATH (PATH OF LIGHT RECEIVED BY LIGHT-RECEIVING UNIT 17)
20: ELECTRIC TRANSMISSION PATH (ELECTRICAL WIRING)
21: SPACER
22: LIGHT-EMITTING UNIT
23: WAFER PAD (ELECTRICAL CONNECTION UNIT)
24: BORE (THROUGH HOLE)
25: BORE
26: PLACING SECTION
28: OPENING
29: OPENING
30: PERIPHERAL REGION OF OPENING 28
31: SCREW
32: SCREW HOLE
33: SCREW HOLE
34: SPACE ADJUSTMENT UNIT
34a: SPACE ADJUSTMENT UNIT
34b: SPACE ADJUSTMENT UNIT
35: SCREW
36: SCREW HOLE
37: POSITIONING UNIT
38: SCREW
39: SCREW HOLE
40: PLACEMENT SURFACE OF HOLDING UNIT 14
41: OUTER PERIPHERAL WALL
42: OUTER PERIPHERAL SURFACE
G: GAP BETWEEN HOLDING UNIT 14 AND HYBRID BOARD 15
M: MIRROR

The invention claimed is:

1. A test system comprising:
a holding unit that holds a light-receiving unit receiving light emitted from a test object;
an optical path forming unit that is a board in which an optical transmission path is formed as a path of the light received by the light-receiving unit;
a probe that contacts the test object; and
electrical wiring that is electrically connected to the probe, wherein
the optical transmission path is separately formed away from the holding unit in an advancing direction of the light.

2. The test system according to claim 1, wherein
the light-receiving unit is a lens to which the light emitted from the test object converges, and
the holding unit and the optical path forming unit are arranged at separate positions in the advancing direction of the light.

3. The test system according to claim 2 further comprising:
a space adjustment unit that adjusts a space between the holding unit and the optical path forming unit in the advancing direction of the light.

4. The test system according to claim 3, wherein the space adjustment unit has a screw.

5. The test system according to claim 2, wherein
the optical path forming unit has a mirror at a position where the light emitted from the test object is converged by the lens, the mirror changing the advancing direction of the light.

6. The test system according to claim 1, wherein
the holding unit is configured to attach or detach the light-receiving unit.

7. The test system according to claim 6, wherein
the light-receiving unit has a projection in a direction that crosses an attachment/detachment direction of the light-receiving unit, and
the holding unit has a contact section that contacts the projection in the attachment/detachment direction of the light-receiving unit when the light-receiving unit is attached.

8. The test system according to claim 7, wherein
the holding unit has a pressing section that presses the projection on an opposite side from
the contact section in the attachment/detachment direction of the light-receiving unit when the light-receiving unit is attached.

9. The test system according to claim 1, wherein
the light-receiving unit is assembled in a through hole formed in the holding unit, and
at least a part of an end of the light-receiving unit in a direction that crosses an advancing direction of the light is coated with an organic insulating film.

10. The test system according to claim 1, wherein
the optical transmission path is physically separated away from the light-receiving unit.

11. The test system according to claim 1 wherein the optical transmission path changes the advancing direction of the light emitted from the test object.

* * * * *